(12) United States Patent
Lee et al.

(10) Patent No.: US 9,793,251 B2
(45) Date of Patent: Oct. 17, 2017

(54) SEMICONDUCTOR PACKAGE AND MANUFACTURING METHOD THEREOF

(71) Applicant: NEPES CO., LTD., Chungcheongbuk-do (KR)

(72) Inventors: Jun-Kyu Lee, Chungcheongbuk-do (KR); Yong-Tae Kwon, Chungcheongbuk-do (KR)

(73) Assignee: NEPES CO., LTD., Chungcheongbuk-Do (KR)

( * ) Notice: Subject to any disclaimer, the term of this patent is extended or adjusted under 35 U.S.C. 154(b) by 0 days.

(21) Appl. No.: 14/955,010

(22) Filed: Nov. 30, 2015

(65) Prior Publication Data

US 2016/0190108 A1    Jun. 30, 2016

(30) Foreign Application Priority Data

Dec. 30, 2014    (KR) .......................... 10-2014-0194450

(51) Int. Cl.
*H01L 21/52*    (2006.01)
*H01L 23/31*    (2006.01)
(Continued)

(52) U.S. Cl.
CPC .............. *H01L 25/16* (2013.01); *H01L 23/13* (2013.01); *H01L 23/3128* (2013.01); *H01L 23/49827* (2013.01); *H01L 24/19* (2013.01); *H01L 24/20* (2013.01); *H01L 21/568* (2013.01); *H01L 23/49816* (2013.01); *H01L 23/49822* (2013.01); *H01L 2224/04105* (2013.01); *H01L 2224/12105* (2013.01); *H01L 2224/24195* (2013.01); *H01L 2924/13091* (2013.01);
(Continued)

(58) Field of Classification Search
CPC ...... H01L 25/16; H01L 23/3178; H01L 24/09; H01L 25/50; H01L 21/52
USPC .......................................................... 257/692
See application file for complete search history.

(56) References Cited

U.S. PATENT DOCUMENTS

2006/0113679 A1*    6/2006    Takatsu ................... H01L 25/16
                                                            257/778
2009/0102037 A1*    4/2009    Kim ..................... H01L 23/49827
                                                            257/686
(Continued)

FOREIGN PATENT DOCUMENTS

| KR | 10-0485111 | 4/2005 |
| KR | 10-2009-0021452 | 3/2009 |
| KR | 10-2012-0010021 | 2/2012 |

OTHER PUBLICATIONS

Office Action dated May 1, 2016 for Korean Patent Application No. 10-2014-0194450 and its machine translation provided by Google Translate.

(Continued)

*Primary Examiner* — Moazzam Hossain
*Assistant Examiner* — Omar Mojaddedi
(74) *Attorney, Agent, or Firm* — Ladas & Parry, LLP (57) ABSTRACT

Disclosed herein is a semiconductor package in which a semiconductor chip and a mounting device are packaged together. The semiconductor package includes a semiconductor chip, a mounting block on which a first mounting device is mounted on a substrate that includes a circuit formed thereon, and an interconnection part configured to electrically connect the semiconductor chip to the mounting block.

18 Claims, 5 Drawing Sheets

(51) Int. Cl.
*H01L 23/498* (2006.01)
*H01L 25/16* (2006.01)
*H01L 23/00* (2006.01)
*H01L 23/13* (2006.01)
*H01L 21/56* (2006.01)

(52) U.S. Cl.
CPC ............... *H01L 2924/1431* (2013.01); *H01L 2924/1432* (2013.01); *H01L 2924/1434* (2013.01); *H01L 2924/1436* (2013.01); *H01L 2924/1437* (2013.01); *H01L 2924/1438* (2013.01); *H01L 2924/1441* (2013.01); *H01L 2924/15313* (2013.01); *H01L 2924/182* (2013.01); *H01L 2924/19041* (2013.01); *H01L 2924/19042* (2013.01); *H01L 2924/19043* (2013.01); *H01L 2924/19105* (2013.01); *H01L 2924/37001* (2013.01)

(56) References Cited

U.S. PATENT DOCUMENTS

| | | | | |
|---|---|---|---|---|
| 2010/0133704 | A1* | 6/2010 | Marimuthu | H01L 21/565 257/778 |
| 2012/0146216 | A1* | 6/2012 | Kang | H01L 21/486 257/737 |
| 2012/0286419 | A1 | 11/2012 | Kwon et al. | |
| 2013/0234308 | A1* | 9/2013 | Yamada | H01L 24/14 257/676 |
| 2013/0241042 | A1* | 9/2013 | Kwon | H01L 21/568 257/676 |
| 2013/0256916 | A1* | 10/2013 | Kwon | H01L 23/488 257/777 |
| 2014/0264836 | A1 | 9/2014 | Chun et al. | |
| 2015/0366063 | A1* | 12/2015 | Takagi | H05K 3/284 361/743 |
| 2016/0100489 | A1* | 4/2016 | Costa | H05K 3/30 361/764 |

OTHER PUBLICATIONS

Notice of Allowance dated Aug. 24, 2016 for Korean Patent Application No. 10-2014-0194450 and its English translation provided by Applicant's foreign counsel.

Office Action dated Oct. 13, 2016 for Taiwanese Patent Application No. 104140268 and its English translation provided by Applicant's foreign counsel.

* cited by examiner

SEMICONDUCTOR PACKAGE AND MANUFACTURING METHOD THEREOF

CROSS-REFERENCE TO RELATED APPLICATION

This application claims the benefit of Korean Patent Application No. 10-2014-0194450, filed on Dec. 30, 2014 in the Korean Intellectual Property Office, the disclosure of which is incorporated herein by reference.

BACKGROUND

1. Field

Embodiments of the present invention relate to a semiconductor package and a method of fabricating the same. More specifically, embodiments of the present invention relate to a semiconductor package in which a semiconductor chip and a mounting device are simultaneously packaged, and a method of fabricating the same.

2. Description of the Related Art

Recently, as chip sizes of semiconductor devices decrease and the number of input/output terminals increases due to fine processing technology and diversified functions, pitches of pad electrodes are gradually becoming finer. In addition, as convergence of various functions is accelerated, system-level packaging technology for integrating a plurality of devices in a single package is becoming critical. Further, the system-level packaging technology has been developed into three-dimensional stacking technology for maintaining short signal intervals to minimize noise between operations and improve signal speed.

Semiconductor packages have been fabricated by a flip-chip method using a bumping process for electrical connection between semiconductor chips or between a semiconductor chip and a substrate. However, such a bumping process has a problem in that the number of input/out pads and the chip size are limited due to limitations in reducing the size of the bump.

That is, when a size of a semiconductor chip is reduced and the number of input/out pads increases, a semiconductor package has limitations in fully accommodating a plurality of solder balls, that is, input/out terminals, on a top surface of the semiconductor chip. In order to solve the problem, the semiconductor packages have been developed to have an embedded structure in which a semiconductor chip is embedded in a circuit board, a fan-out structure in which solder balls, that is, final input/out terminals of a semiconductor chip, are arranged on an outer peripheral surface of the semiconductor chip, or the like.

Meanwhile, when active devices and passive devices are arranged in a single package, the active devices and passive devices are normally mounted on one package substrate at the same time. Here, the passive devices, which have a smaller number of terminals and larger pitches than the active devices, can be simply mounted on a low-end substrate by a normal surface mounting technology (SMT), but when the passive devices are mounted together with the active devices on the same substrate, a high-end package substrate is required, which results in an increase in package prices and process difficulties.

In addition, when the active devices and the passive devices are arranged in a package disposed on a carrier, a pick- and placement process is normally used. In this case, when a plurality of passive devices are included in a package, time spent in the pick- and placement process increases which directly results in an increase in package prices.

A semiconductor module and a method thereof are disclosed in Korean Unexamined Patent Publication No. 10-2012-0010021 (published Feb. 2, 2012).

PRIOR ART DOCUMENT

Patent Document

Korean Unexamined Patent Publication No. 10-2012-0010021 (published Feb. 2, 2012)

SUMMARY

Therefore, it is an aspect of the present invention to provide a semiconductor package in which a substrate including a mounting device is formed separately from a semiconductor chip, and a method of fabricating the same.

Additional aspects of the invention will be set forth in part in the description which follows and, in part, will be obvious from the description, or may be learned by practice of the invention.

In accordance with one aspect of the present invention, a semiconductor package includes a semiconductor chip, a mounting block on which a first mounting device is mounted on a substrate that includes a circuit formed thereon, and an interconnection part configured to electrically connect the semiconductor chip to the mounting block.

The semiconductor package may further include an encapsulant molded on the semiconductor chip and the mounting block. A pad of the semiconductor chip and a conductive material of the mounting block may be exposed on one surface of the encapsulant. The interconnection part may be electrically connected to the pad of the semiconductor chip and the conductive material of the mounting block.

The mounting block may be disposed on an outer side of the semiconductor chip, and the encapsulant may fill a space between the semiconductor chip and the mounting block to integrate the semiconductor chip and the mounting block.

The mounting block may include a substrate that includes a via hole, a conductive material passing through the via hole of the substrate, and the first mounting device electrically connected to one side of the conductive material, and the other side of the conductive material may be electrically connected to the interconnection part.

The first mounting device may include a passive element.

The substrate may include an opening disposed at a center portion thereof, and the semiconductor chip may be accommodated in the opening and mounted on the interconnection part.

The substrate may include a plurality of substrates configured to surround the semiconductor chip.

The first mounting device may include different types of mounting devices, and the substrate may include different types of substrates on which the different types of mounting devices are mounted.

The mounting block may be connected to the interconnection part to form a space in which the semiconductor chip is accommodated, and the semiconductor chip may be accommodated in the space formed by the mounting block and connected to the interconnection part.

The semiconductor package may further include a second mounting device accommodated in the space formed by the mounting block and connected to the interconnection part.

The semiconductor package may further include an encapsulant molded on the semiconductor chip, the mounting block, and the second mounting device. A pad of the semiconductor chip, a conductive material of the mounting block, and a conductive material of the second mounting device may be exposed on one surface of the encapsulant. The interconnection part may be electrically connected to the pad of the semiconductor chip, the conductive material of the mounting block, and the conductive material of the second mounting device.

In accordance with one aspect of the present invention, a method of fabricating a semiconductor package includes mounting a mounting device on a mounting block configured to form an opening in which a semiconductor chip is to be accommodated, loading the semiconductor chip in the opening formed by the mounting block loaded on a carrier, molding an encapsulant on the semiconductor chip, the mounting block, and the mounting device, and forming an interconnection part on a surface on which the carrier is removed, to electrically connect the semiconductor chip to the mounting block.

The loading of the semiconductor chip may include attaching a surface of the mounting block to the carrier and loading the semiconductor chip on the carrier through the opening formed by the mounting block, and the molding of the encapsulant may include integrating the semiconductor chip, the mounting block, and the mounting device, disposed on the carrier.

The mounting block may be formed by coating a via hole formed in a substrate with a conductive material and electrically connecting a top of the substrate to a bottom of the substrate, and the mounting device may be mounted to be electrically connected to the conductive material of the mounting block.

The mounting block may include a plurality of mounting blocks, and the plurality of mounting blocks may be arranged to surround the opening in which the semiconductor is accommodated.

A first mounting device may be mounted on the mounting block, and a second mounting device may be mounted together with the semiconductor chip in the opening formed by the mounting block loaded on the carrier.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Reference will now be made in detail to the embodiments of the present invention, examples of which are illustrated in the accompanying drawings, wherein like reference numerals refer to like elements throughout. The embodiments below are provided merely to allow one of ordinary skill in the art to implement the present invention, and are not meant to limit the present invention. The present invention may be implemented through other modified embodiments. In the drawings, thickness, lengths, and widths of constituent components may be exaggerated for convenience, and descriptions of extraneous portions are omitted in order to clearly describe the present invention. In the following description, the term "and/or" includes any and all combinations of one or more of the listed items.

Figure 1:
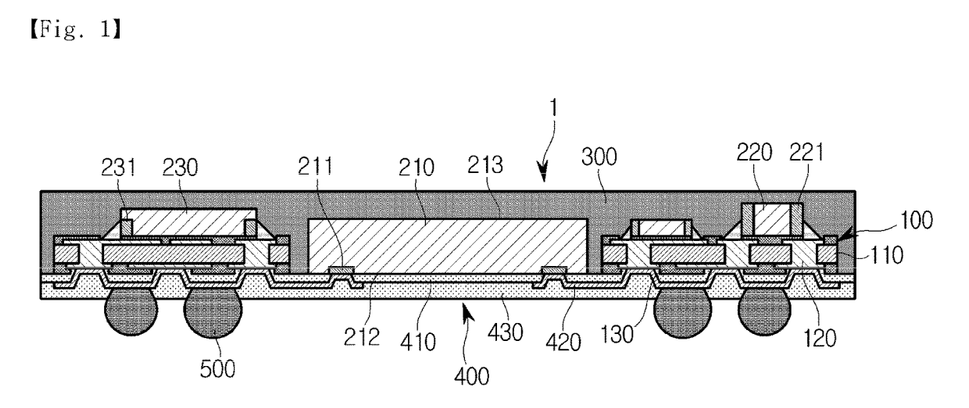
FIG. 1 is a cross-sectional view illustrating a structure of a semiconductor package in accordance with an embodiment of the present invention.
Figure 2:
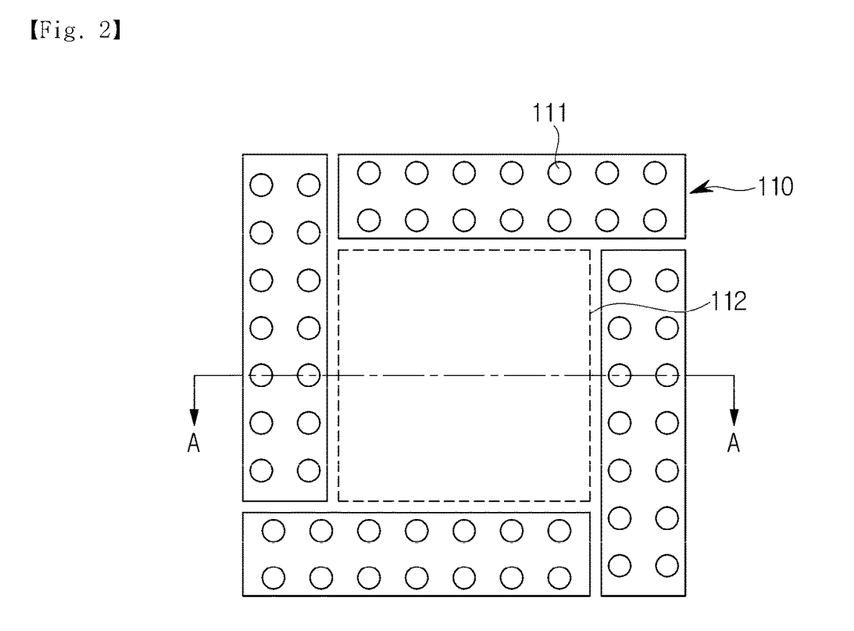
FIG. 2 is a plan view illustrating a board in accordance with an embodiment of the present invention.

FIG. 1 is a cross-sectional view illustrating a structure of a semiconductor package 1 in accordance with an embodiment of the present invention, and FIG. 2 is a plan view illustrating a board 110 in accordance with an embodiment of the present invention.

With reference to FIGS. 1 and 2, the semiconductor package 1 may include a mounting block on which mounting devices 220 and 230 are mounted, a semiconductor chip 210, an encapsulant 300 molded on the mounting block and the semiconductor chip 210, an interconnection part 400 electrically connecting the mounting block to the semiconductor chip 210, and an external connection terminal 500.

The mounting block may include a circuit board 100 and the mounting devices 220 and 230 mounted on the circuit board 100. The circuit board 100 may be, for example, a printed circuit board (PCB).

The circuit board 100 may be formed by forming a via-hole 111 (please refer to FIG. 3) in an insulating board 110, filling the via-hole 111 with a conductive filler 120 to electrically connect a top of the board 110 to a bottom of the board 110, and forming an electric circuit on one surface or both surfaces of the board 110. Meanwhile, the board 110 may be formed of fiber-reinforced glass or a plastic.

An insulating layer 130 insulating the conductive filler 120 from the outside may be formed on both surfaces of the board 110, and portions of the insulating layer 130 may be open to expose the conductive filler 120. In addition, the mounting devices 220 and 230 or the interconnection layer 420 may be connected to the portions exposing the conductive filler 120. For example, the mounting devices 220 and 230 may be connected to the conductive filler 120 exposed on one surface of the circuit board 100, and the interconnection layer 420 may be connected to the conductive filler 120 exposed on the other surface of the circuit board 100.

The via-hole 111 may be used as a path for transmitting an electrical signal in a vertical direction of the circuit board 100. The via-hole 111 may be filled with the conductive filler 120 such as a conductive paste. Meanwhile, the via-hole 111 may include a through hole such as a through silicon via (TSV). In addition, the via-hole 111 may include a plurality of via-holes or may be disposed at a different position, as needed.

Although not shown in FIGS. 1 and 2, the circuit board 100 may include a pad (not shown) formed on the conductive filler 120 exposed in the insulating layer 130. The pad may be formed of a conductive material including a metal, and may serve to easily transmit an electrical signal to the conductive filler 120.

The mounting devices 220 and 230 may be mounted on the circuit board 100 to form a mounting block. One mounting device or a plurality of mounting devices may be mounted on one circuit board 100.

The mounting block may form a space 112 in which the semiconductor chip 210 is accommodated. For example, the mounting block may include a plurality of mounting blocks, and the plurality of mounting blocks may be arranged to surround the space 112 accommodating the semiconductor chip 210. FIG. 2 illustrates four rectangular mounting blocks perpendicularly arranged to form the space 112 in a center thereof. However, FIG. 2 merely illustrates an embodiment of a method of arranging the mounting blocks, and thus various methods of arranging the mounting blocks may be provided.

Meanwhile, the space 112 formed between the mounting blocks is configured to accommodate the semiconductor chip 210, and it is preferable that a width of the space 112 be greater than a width of the semiconductor chip 210.

The semiconductor chip 210 includes a semiconductor integrated circuit (IC). The semiconductor IC interconnects circuit devices, such as transistors, diodes, and resistors, in a semiconductor substrate. In addition, the semiconductor chip 210 may be a memory chip or a logic chip. For example, the memory chip may include a DRAM, an SRAM, a flash memory, a PRAM, an ReRAM, an FeRAM, or an MRAM. For example, the logic chip may be a controller controlling the memory chip.

The semiconductor chip 210 may include an active plane 212 having an active region in which a circuit is formed (a plane opposed to the active plane 212 is referred to as an inactive plane 213), a pad 211 configured to exchange a signal with an outside device may be formed on the active plane 212. The pad 211 may be a conductive material, and may function as a path connecting the semiconductor chip 210 to the outside device. In addition, the pad 211 may be integrally formed with the semiconductor chip 210.

The pad 211 may be electrically connected to the interconnection layer 420. Here, the pad 211 and the interconnection layer 420 may be connected by a bump or a conductive adhesive material. For example, the pad 211 and the interconnection layer 420 may be connected by a solder joint method using a metal melting agent including lead (Pb) or tin (Sn).

The mounting devices 220 and 230 may include a passive element 220 or a semiconductor device 230. The passive element 220 may refer to an element that consumes, accumulates, or emits power supplied thereto, and include an electronic device, a resistor, a capacitor, an inductor, a transformer, a relay, or the like. In addition, the semiconductor device 230 may include a diode, a transistor, a rectifier, or the like.

Meanwhile, the mounting devices 220 and 230 may include a variety of elements that can be mounted on the circuit board 100. For example, the mounting devices 220 and 230 may include an active element.

The mounting devices 220 and 230 may include pads 221 and 231 to exchange a signal with an external device. The pads 221 and 231 may be formed of conductive materials.

The mounting devices 220 and 230 mounted on the circuit board 100 may have a smaller number of terminals and a wider pitch than the semiconductor chip 210. Accordingly, the mounting devices 220 and 230 may be mounted on a low-end circuit board, compared to a circuit board on which the semiconductor chip 210 is mounted. Accordingly, there is no need to mount the semiconductor chip 210 and the mounting devices 220 and 230 on one circuit board. Since the circuit board 100 is selected depending on the types of the mounting devices 220 and 230 independently from the semiconductor chip 210, production cost may be lowered.

In addition, since the circuit board 100 is only formed in a portion on which the mounting devices 220 and 230 are mounted, a size of the circuit board 100 may be minimized, and a size, weight, and manufacturing cost of the semiconductor package 1 may be decreased. In addition, the mounting devices 220 and 230 may be mounted on the circuit board 100 using surface mount technology (SMT).

Figure 6:
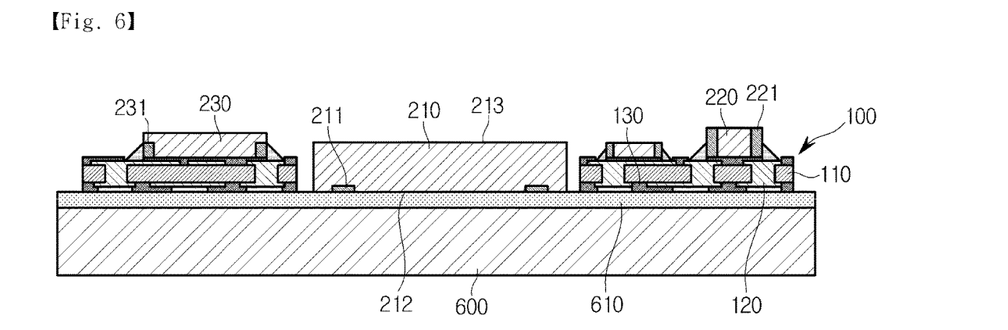
FIG. 6 is a cross-sectional view illustrating a process of loading a mounting block and a semiconductor chip described with reference to FIG. 5 on a carrier.

Meanwhile, when the mounting block is integrated with the plurality of mounting devices 220 and 230, a loading process may be completed by loading the semiconductor chip 210 and the mounting block on a carrier 600 (please refer to FIG. 6). Accordingly, a process time may be reduced, compared with a time to individually load each of the mounting devices 220 and 230 using a pick-and-place process. In addition, since a mounting block with no defect can be selected and mounted, problems occurring when the mounting devices 220 and 230 are individually loaded using the pick-and-place process may be prevented and a process yield may be improved.

The encapsulant 300 may be molded to integrate the semiconductor chip 210 and the mounting block. For example, the encapsulant 300 may fill a space between the semiconductor chip 210 and the mounting block. The encapsulant 300 may include an insulating material, such as an epoxy mold compound (EMC).

In addition, the encapsulant 300 may surround and seal the mounting block so that the mounting block is not exposed to the outside, and cover upper surfaces of the semiconductor chip 210 and the mounting block to protect the semiconductor chip 210 and the mounting block from the outside.

Meanwhile, the pad 211 of the semiconductor chip 210 and the conductive filler 120 of the circuit board 100 may be exposed on one surface of the encapsulant 300.

The interconnection part 400 may electrically connect the semiconductor chip 210 to the mounting devices 220 and 230 mounted on the mounting block. The interconnection part 400 may include a conductive material. For example, the interconnection part 400 may include a metal, such as copper, a copper alloy, aluminum, or an aluminum alloy. In addition, the interconnection part 400 may be formed by rerouting metal lines.

The interconnection part 400 may include a first insulating layer 410 formed on one surface of the encapsulant 300 and including an opening exposing the pad 211 of the semiconductor chip 210 and the conductive filler 120 of the circuit board 100, and an interconnection layer 420 formed on the first insulating layer 410 to form an interconnection and connected to the pad 211 of the semiconductor chip 210 and the conductive filler 120 of the circuit board 100. In addition, the interconnection part 400 may further include a second insulating layer 430 formed on the first insulating layer 410 and the interconnection layer 420. The second insulating layer 430 may expose portions of the interconnection layer 420.

One side of the external connection terminal 500 may be connected to the interconnection layer 420 exposed through an opening of the second insulating layer 430, and the other side of the external connection terminal 500 may be connected to an external substrate (not shown) or another semiconductor package.

Although solder balls are illustrated as an example of the external connection terminal 500 in FIG. 1, solder bumps may be used. In addition, a surface treatment, such as organic coating or metal plating, may be executed on a surface of the external connection terminal 500 to prevent oxidation thereof. For example, the organic coating may be an organic solder preservation (OSP) coating, and the metal plating may be gold (Au), nickel (Ni), lead (Pb), or silver (Ag) plating.

Hereinafter, a method of fabricating a semiconductor package 1 in accordance with an embodiment of the present invention is described in detail with reference to FIGS. 3 to 12. First, a process of providing a mounting block is described with reference to FIGS. 3 to 5.

Figure 3:
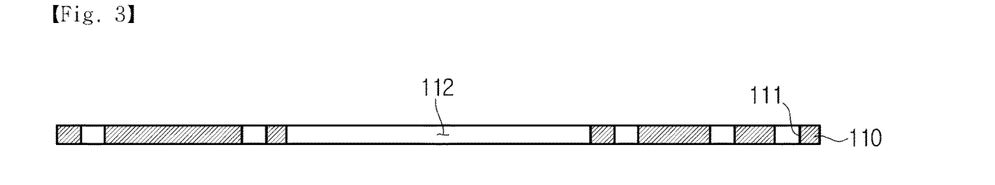
FIG. 3 is a cross-sectional view taken along line A-A of FIG. 2.
Figure 4:
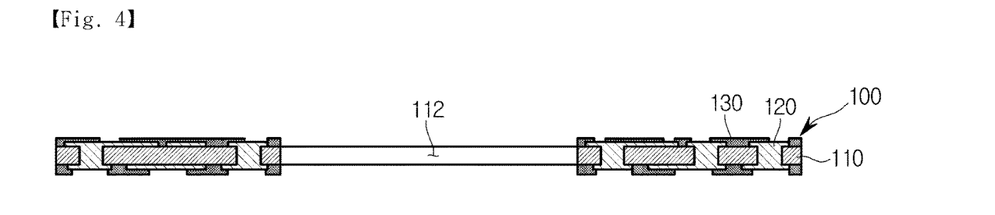
FIG. 4 is cross-sectional view illustrating a process of forming a circuit on a board.
Figure 5:
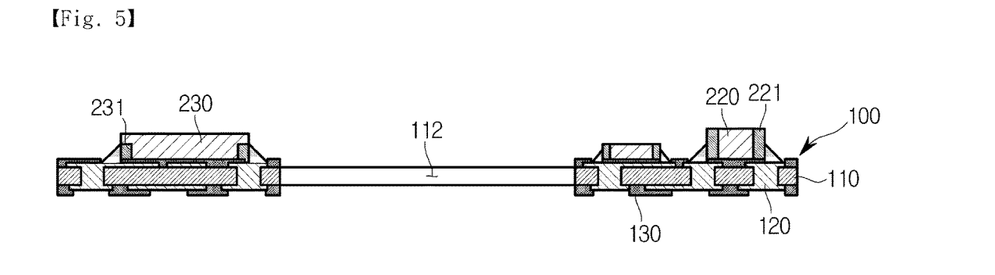
FIG. 5 is a cross-sectional view illustrating a process of mounting a semiconductor device and a passive element on a circuit board.

FIG. 3 is a cross-sectional view taken along line A-A of FIG. 2, FIG. 4 is cross-sectional view illustrating a process of forming a circuit on a board 110, and FIG. 5 is a cross-sectional view illustrating a process of mounting a semiconductor device 230 and a passive element 220 on the circuit board 100.

The mounting block of the semiconductor package 1 in accordance with the embodiment of the present invention may be provided by forming the circuit board 100 for mounting the mounting devices 220 and 230 and mounting the mounting devices 220 and 230 on the circuit board 100.

In the process of forming the circuit board 100, a top and a bottom of the board 110 may be electrically connected by filling a via-hole formed in the board 110 with a conductive filler 120. In addition, an insulating layer 130 is formed on each surface of the board 110, and an opening is formed in the insulating layer 130 to expose portions of the conductive filler 120.

The conductive filler 120 may include a conductive paste. Alternatively, the top and the bottom of the board 110 may be electrically connected by inserting a conductive pin in the via-hole 111, and performing metal plating on the via-hole 111.

The mounting devices 220 and 230 are mounted on one surface of the circuit board 100. A process of mounting the mounting devices 220 and 230 on the circuit board 100 may be performed using an SMT. Pads 221 and 231 of the mounting devices 220 and 230 may be connected to the conductive filler 120 exposed through the opening of the insulating layer 130. In addition, the mounting devices 220 and 230 may be securely fixed to the circuit board 100 by an adhesive or the like.

Meanwhile, a center portion of the mounting block may be open to form a space 112, and a semiconductor chip 210 may be disposed in the space 112. For example, a plurality of mounting blocks may be arranged to surround the space 112 accommodating the semiconductor chip 210. Here, a width of the space 112 formed in the center portion of the mounting block may be greater than a width of the semiconductor chip 210. The space 112 between the semiconductor chip 210 and the mounting block may be filled with the encapsulant 300, which will be described later, and thereby the semiconductor chip 210 and the mounting block may be integrated.

FIG. 6 is a cross-sectional view illustrating a process of loading the mounting block and the semiconductor chip 210 described with reference to FIG. 5 on a carrier 600.

An adhesive layer 610 may be formed on a surface of the carrier 600. The adhesive layer 610 may be, for example, a double-sided tape.

The mounting block and the semiconductor chip 210 may be loaded on the surface of the carrier 600, on which the adhesive layer 610 is formed. For example, after the mounting block is fixed to the adhesive layer 610, the semiconductor chip 210 may be fixed to the adhesive layer 610 by being inserted in the opening formed by the mounting block. Moreover, the mounting block may be loaded after the semiconductor chip 210 is loaded on the carrier 600.

The mounting block may be loaded such that a surface of the circuit board 100 opposed to the surface of the circuit board 100 that the mounting devices 220 and 230 are mounted on faces the carrier 600. In addition, the semiconductor chip 210 may be loaded such that an active plane 212 thereof faces the carrier 600. Here, the active plane 212 of the semiconductor chip 210 refers to a plane in which a circuit and a pad 211 are formed.

Figure 7:
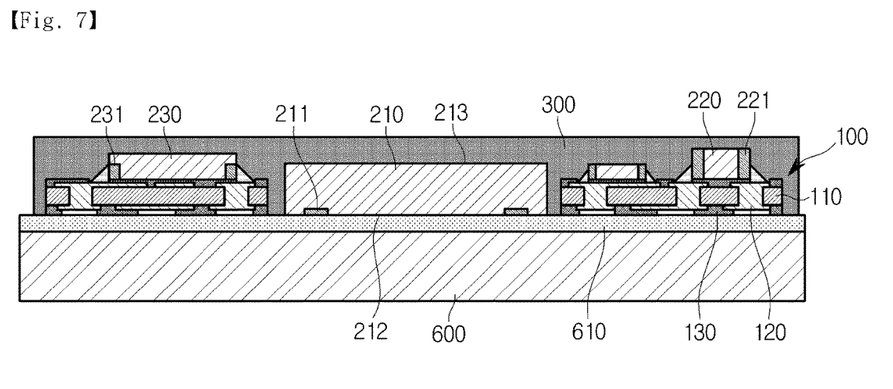
FIG. 7 is a cross-sectional view illustrating a process of molding an encapsulant.

FIG. 7 is a cross-sectional view illustrating a process of molding the encapsulant 300.

The encapsulant 300 may be molded to integrate the semiconductor chip 210 and the mounting block that are loaded on the carrier 600. In this regard, the encapsulant 300 may fill a space between the semiconductor chip 210 and the mounting block. Here, an inner surface of the opening formed in the mounting block and a side surface of the semiconductor chip 210 may be preferably spaced apart from each other. Since the encapsulant 300 penetrates and fill the space, the semiconductor chip 210 and the mounting block may be securely fixed.

Meanwhile, the encapsulant 300 may seal the mounting block to surround an outer side of the mounting block, and cover upper portions of the semiconductor chip 210 and the mounting devices 220 and 230. That is, an inactive plane 213 of the semiconductor chip 210 and upper surfaces of the mounting devices 220 and 230 may not be exposed to the outside after the encapsulant 300 is molded on the carrier 600.

Alternatively, the encapsulant 300 may be molded in such a manner that the inactive plane 213 of the semiconductor chip 210 or the upper surfaces of the mounting devices 220 and 230 are exposed to the outside. For example, the encapsulant 300 may be molded to have the same height as a higher one of the upper surfaces of the semiconductor chip 210 and the mounting devices 220 and 230, to minimize a height of the semiconductor package 1. Alternatively, the inactive plane 213 of the semiconductor chip 210 or the upper surfaces of the mounting devices 220 and 230 may be exposed using a grinding process after the encapsulant 300 is molded to cover the semiconductor chip 210 and the mounting devices 220 and 230.

Figure 8:
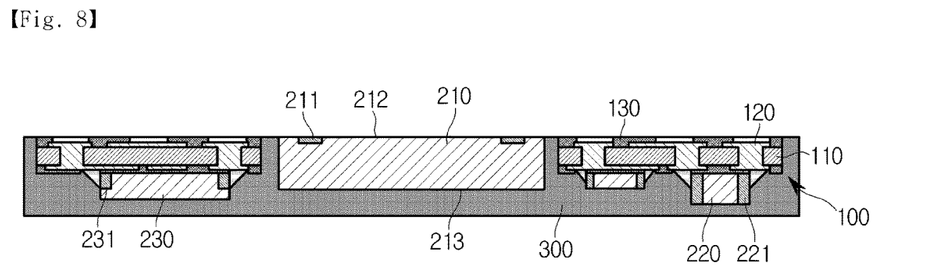
FIG. 8 is a cross-sectional view illustrating a state in which a carrier is removed.
Figure 9:
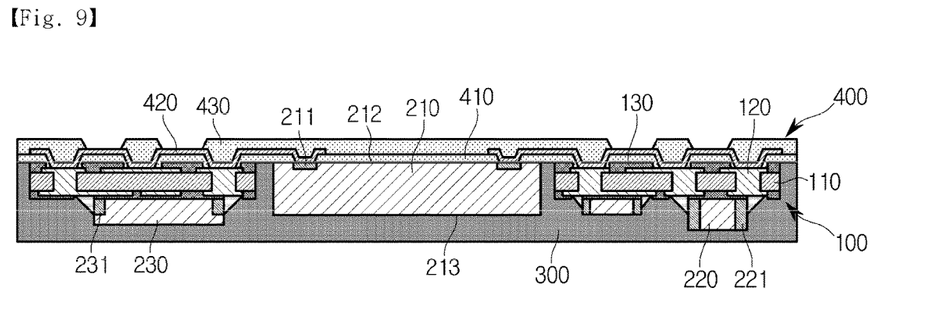
FIG. 9 is a cross-sectional view illustrating a process of forming an interconnection part.

FIG. 8 is a cross-sectional view illustrating a state in which a carrier 600 is removed from the circuit board 100, and FIG. 9 is a cross-sectional view illustrating a process of forming an interconnection part 400.

With reference to FIGS. 8 and 9, when the encapsulant 300 is cured, the carrier 600 and the adhesive layer 610 are removed and the interconnection part 400 is formed on a surface from which the carrier 600 and the adhesive layer 610 have been removed. The mounting block and the semiconductor chip 210 may be exposed on the surface from which the carrier 600 and the adhesive layer 610 are removed. More specifically, a surface of the circuit board 100 on which the mounting devices 220 and 230 are not mounted and the active plane 212 of the semiconductor chip 210 may be exposed.

Alternatively, the surface of circuit board 100 and the active plane 212 of the semiconductor chip 210 may be separated from the carrier 600 using a bump or the like during the process of loading the semiconductor chip 210 and the mounting block on the carrier 600. In this case, the encapsulant 300 may penetrate into a space between the carrier 600, and the semiconductor chip 210 and the mounting block, and thus the semiconductor chip 210 and the mounting block may not be exposed on the surface of the encapsulant 300 even after the carrier 600 is removed. However, even in this case, since the bump or the like is exposed through the surface of the encapsulant 300, the interconnection layer 420 may be electrically connected to the semiconductor chip 210 and the mounting devices 220 and 230.

A process of forming the interconnection part 400 will be described in detail.

First, a first insulating layer 410 is formed on the surface on which the carrier 600 has been removed. Here, the first insulating layer 410 may be formed to expose a portion of the conductive filler 120 of the circuit board 100 and the pad 211 of the semiconductor chip 210. An etching process may be used to expose the portion of the first insulating layer 410. Meanwhile, the first insulating layer 410 may be formed excluding the exposed area by using a masking process or the like.

After the first insulating layer 410 is formed, an interconnection layer 420 may be formed. The interconnection layer 420 may form a circuit through a rerouting process, and may electrically connect the pad 211 of the semiconductor chip 210 to the conductive filler 120 of the circuit board 100.

Finally, a second insulating layer 430 is formed. The second insulating layer 430 may be formed on the first insulating layer 410 and the interconnection layer 420 and may expose a portion of the interconnection layer 420. The interconnection layer 420 exposed through the second insulating layer 430 may be electrically connected to an external circuit.

Figure 10:
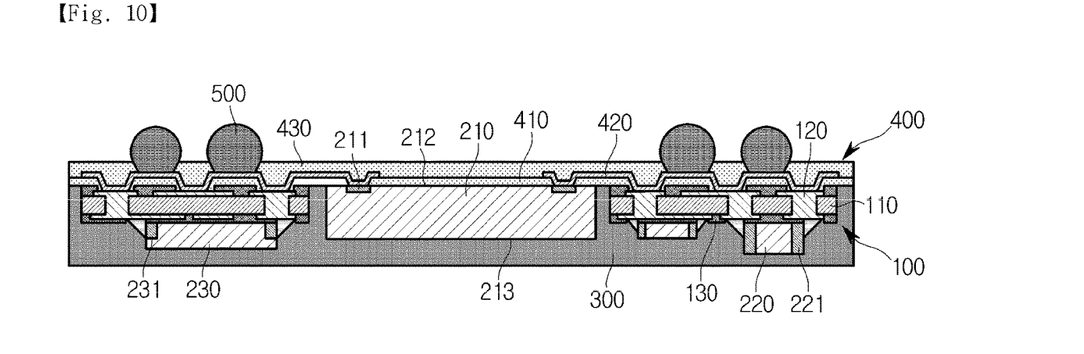
FIG. 10 is a cross-sectional view illustrating a process of forming an external connection terminal.

FIG. 10 is a cross-sectional view illustrating a process of forming an external connection terminal 500.

The external connection terminal 500 is attached to the second insulating layer 430 and connected to the exposed portion of the interconnection layer 420. The external connection terminal 500 may be attached using a conductive adhesive material.

By the attachment of the external connection terminal 500, the semiconductor chip 210 and the mounting devices 220 and 230 may be electrically connected to the external circuit via the interconnection layer 420 and the external connection terminal 500.

Figure 11:
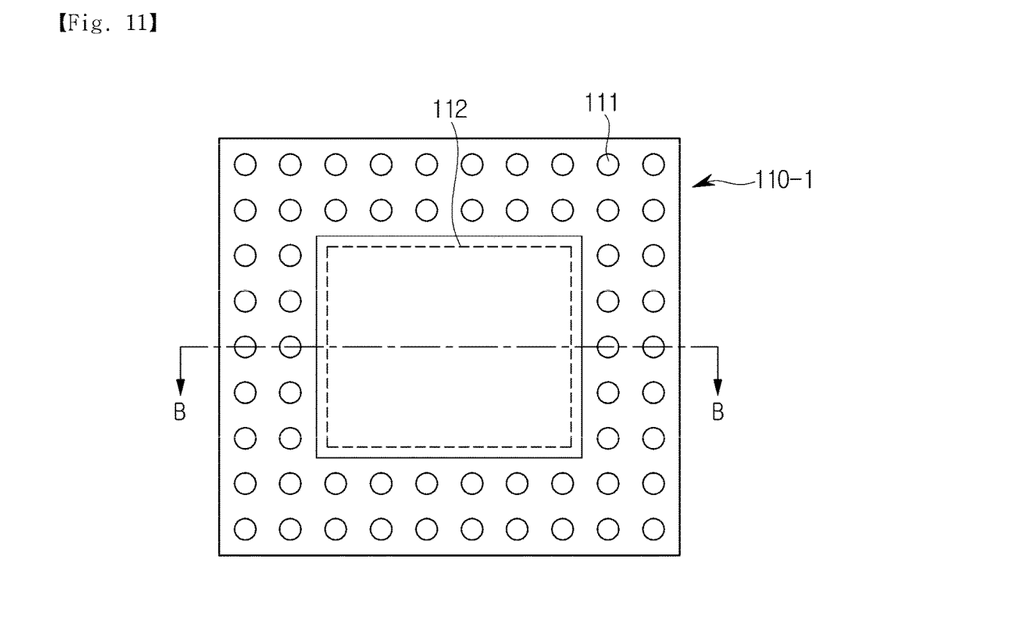
FIG. 11 is a plan view illustrating a board in accordance with another embodiment of the present invention.

FIG. 11 is a plan view illustrating a board 110-1 in accordance with another embodiment of the present invention.

The board 110-1 in accordance with the embodiment of the present invention may include an opening, in which the semiconductor chip 210 is inserted, in a center portion thereof. For example, the board 110-1 may have a tetragonal shape, and an opening 112 passing through the board 110-1 according to a shape of the semiconductor chip 210 may be formed in the center portion of the board 110-1.

The process of forming the semiconductor package 1 may be performed at a high temperature. In particular, since the process of forming the interconnection part 400 is normally executed at a high temperature, a deformation of the encapsulant 300 may occur. Here, the deformation of the encapsulant 300 may be minimized by forming the board 110-1 in an integrated form. Accordingly, during the process of forming the interconnection layer 420, the interconnection layer 420 may be formed to match fine pitches of the pad 211 of the semiconductor chip 210 and the conductive filler 120 of the circuit board 100, which are exposed through the encapsulant 300.

Figure 12:
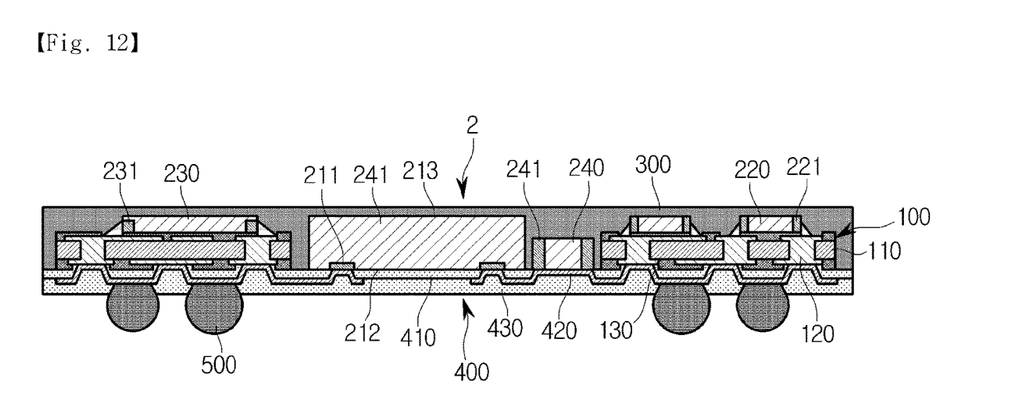
FIG. 12 is cross-sectional view illustrating a structure of a semiconductor package in accordance with another embodiment of the present invention.

FIG. 12 is cross-sectional view illustrating a structure of a semiconductor package 2 in accordance with another embodiment of the present invention.

In the semiconductor package 2 in accordance with the embodiment of the present invention, another mounting device 240 may be loaded together with a semiconductor chip 210 in a space 112 between mounting blocks. Here, elements mounted on a circuit board 100 are referred to as first mounting devices 220 and 230, and the mounting device 240 loaded in the space 112 between the mounting blocks is referred to as a second mounting device 240.

The second mounting device 240 may be directly connected to an interconnection layer 420, just like the semiconductor chip 210. That is, a pad 241 of the second mounting device 240 may be connected to the interconnection layer 420 exposed through a first insulating layer 410.

In addition, an encapsulant 300 may integrate the mounting block on which the semiconductor chip 210 and the first mounting devices 220 and 230 are mounted, and the second mounting device 240. For example, the encapsulant 300 may fill a space between the semiconductor chip 210 and the second mounting device 240 and between the second mounting device 240 and the mounting block.

Meanwhile, a height of the second mounting device 240 may be higher than heights of the first mounting devices 220 and 230. The overall height of the semiconductor package 2 may be reduced by mounting the first mounting devices 220 and 230 having relatively small heights on the circuit board 100 and the second mounting device 240 having a relatively large height on an interconnection part 400. Compared to the semiconductor package 1 according to the embodiment illustrated in FIG. 1, it can be seen that the overall height of the semiconductor package 2 is smaller than that of the semiconductor package 1.

As is apparent from the above description, in a semiconductor package and a method of fabricating the same in accordance with an embodiment of the present invention, a mounting device is mounted separately from a semiconductor chip. Accordingly, the overall cost of the semiconductor package can be reduced by reducing the price of a substrate on which the mounting block is mounted and decreasing the process time for mounting the mounting device.

In addition, since the semiconductor chip is electrically connected to the mounting device without being mounted on the substrate, the height of the semiconductor package can be lowered, and the weight and the price of the semiconductor package can be reduced.

Further, since the mounting device having a large height is mounted in a space formed by the mounting block in which the semiconductor chip is mounted, the overall height of the semiconductor package can be lowered.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor package, comprising:
a semiconductor chip;
a mounting block on which a first mounting device is mounted on a circuit board that includes a circuit formed thereon;
an interconnection part configured to electrically connect the semiconductor chip to the mounting block; and
an encapsulant molded on the semiconductor chip and the mounting block,
wherein:
the mounting block includes the circuit board that includes a via hole, a conductive material passing through the via hole of the circuit board, and the first mounting device electrically connected to one side of the conductive material;
the circuit board is provided as an integral unit to form an opening at a center portion thereof such that the semiconductor chip is accommodated in the opening;
the other side of the conductive material is electrically connected to the interconnection part;
a pad of the semiconductor chip and the conductive material of the mounting block are exposed to one surface of the encapsulant;
the interconnection part is electrically connected to the pad of the semiconductor chip and the conductive material of the mounting block; and
the encapsulant fills a space between the semiconductor chip and the mounting block to integrate the semiconductor chip and the mounting block.

2. The semiconductor package according to claim 1, wherein the first mounting device includes a passive element.

3. The semiconductor package according to claim 1, wherein:
the first mounting device includes different types of mounting devices; and
the circuit board includes different types of substrates on which the different types of mounting devices are mounted.

4. The semiconductor package according to claim 1, wherein:
the mounting block is connected to the interconnection part, disposed to form a space in which the semiconductor chip is accommodated; and
the semiconductor chip is accommodated in the space formed by the mounting block and connected to the interconnection part.

5. The semiconductor package according to claim 4, further comprising a second mounting device accommodated in the space formed by the mounting block and connected to the interconnection part.

6. The semiconductor package according to claim 5, wherein the encapsulant is molded on the semiconductor chip, the mounting block, and the second mounting device,
the pad of the semiconductor chip, the conductive material of the mounting block, and a conductive material of the second mounting device are exposed to the one surface of the encapsulant; and
the interconnection part is electrically connected to the pad of the semiconductor chip, the conductive material of the mounting block, and the conductive material of the second mounting device.

7. A method of fabricating a semiconductor package, comprising:
mounting a mounting device on a mounting block configured to form an opening in which a semiconductor chip is to be accommodated;
loading the semiconductor chip in the opening formed by the mounting block loaded on a carrier;
molding an encapsulant on the semiconductor chip, the mounting block, and the mounting device; and
forming an interconnection part on a surface on which the carrier is removed, to electrically connect the semiconductor chip to the mounting block,
wherein:
the mounting block is formed by coating a via hole formed in a circuit board with a conductive material and electrically connecting a top of the circuit board to a bottom of the circuit board;
the circuit board is provided as an integral unit to form an opening at a center portion thereof such that the semiconductor chip is accommodated in the opening; and
the mounting device is mounted to be electrically connected to the conductive material of the mounting block.

8. The method according to claim 7, wherein:
the loading of the semiconductor chip includes attaching a surface of the mounting block to the carrier and loading the semiconductor chip on the carrier through the opening formed by the mounting block; and
the molding of the encapsulant includes integrating the semiconductor chip, the mounting block, and the mounting device, disposed on the carrier.

9. The method according to claim 7, wherein the mounting block includes a plurality of mounting blocks, and the plurality of mounting blocks are arranged to surround the opening in which the semiconductor is accommodated.

10. The method according to claim 7, wherein:
a first mounting device is mounted on the mounting block; and
a second mounting device is mounted together with the semiconductor chip in the opening formed by the mounting block loaded on the carrier.

11. A semiconductor package, comprising:
a semiconductor chip;
a mounting block on which a first mounting device is mounted on a circuit board that includes a circuit formed thereon; and
an interconnection part configured to electrically connect the semiconductor chip to the mounting block,
wherein:
the mounting block includes the circuit board that includes a via hole, a conductive material passing through the via hole of the circuit board, and the first mounting device electrically connected to one side of the conductive material;
the other side of the conductive material is electrically connected to the interconnection part;
the circuit board is provided in a plurality of substrates surrounding the semiconductor chip to form an opening at a center portion thereof; and
the semiconductor chip is accommodated in the opening and mounted on the interconnection part.

12. The semiconductor package according to claim 11, further comprising an encapsulant molded on the semiconductor chip and the mounting block, wherein:
a pad of the semiconductor chip and a conductive material of the mounting block are exposed to one surface of the encapsulant; and the interconnection part is electrically connected to the pad of the semiconductor chip and the conductive material of the mounting block.

13. The semiconductor package according to claim 12, wherein:
the mounting block is disposed on an outer side of the semiconductor chip; and
the encapsulant fills a space between the semiconductor chip and the mounting block to integrate the semiconductor chip and the mounting block.

14. The semiconductor package according to claim 11, wherein the first mounting device includes a passive element.

15. The semiconductor package according to claim 11, wherein:
the first mounting device includes different types of mounting devices; and
the circuit board includes different types of substrates on which the different types of mounting devices are mounted.

16. The semiconductor package according to claim 11, wherein:
the mounting block is connected to the interconnection part, disposed to form a space in which the semiconductor chip is accommodated; and
the semiconductor chip is accommodated in the space formed by the mounting block and connected to the interconnection part.

17. The semiconductor package according to claim 16, further comprising a second mounting device accommodated in the space formed by the mounting block and connected to the interconnection part.

18. The method of claim 7, wherein after the molding the encapsulant on the semiconductor chip, the mounting block and the mounting device, the interconnection part on the surface on which the carrier is removed is formed to electrically connect the semiconductor chip to the mounting block.

* * * * *